United States Patent
Chen et al.

(10) Patent No.: US 11,177,730 B2
(45) Date of Patent: Nov. 16, 2021

(54) ON-TIME COMPENSATION IN A POWER CONVERTER

(71) Applicant: Infineon Technologies Austria AG, Villach (AT)

(72) Inventors: Keng Chen, Acton, MA (US); Luca Petruzzi, Andover, MA (US)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/656,344

(22) Filed: Oct. 17, 2019

(65) Prior Publication Data
US 2021/0119524 A1  Apr. 22, 2021

(51) Int. Cl.
  H02M 1/08    (2006.01)
  H02M 3/156   (2006.01)
  H03K 5/24    (2006.01)

(52) U.S. Cl.
  CPC ............ *H02M 1/08* (2013.01); *H02M 3/156* (2013.01); *H03K 5/24* (2013.01)

(58) Field of Classification Search
  CPC ........... H02M 1/08; H02M 3/156; H03K 5/24
  USPC ................................................. 327/108–112
  See application file for complete search history.

(56) References Cited

U.S. PATENT DOCUMENTS

2010/0128500 A1* 5/2010 Chang ............... H02M 3/33507
                                                    363/21.01

OTHER PUBLICATIONS

Bari, Syed, et al., "Fast Adaptive On Time Control for Transient Performance Improvement", Mar. 15, 2015, 2015 IEEE Applied Power Electronics Conference and Exposition (APEC), IEEE, pp. 397-403. (Year: 2015).*
Bari Syed et al: "An enhanced adaptive frequency locked loop for variable frequency controls", 2017 IEEE Applied Power Electronics Conference and Exposition (APEC), IEEE, Mar. 26, 2017 (Mar. 26, 2017), pp. 3402-3408, XP033098699.
Bari, Syed et al: "Fast Adaptive on time control for transient performance Improvement", 2015 IEEE Applied Power Electronics Conference and Exposition (APEC), IEEE, Mar. 15, 2015 (Mar. 15, 2015), pp. 397-403, XP032775247.

(Continued)

*Primary Examiner* — Tomi Skibinski
(74) *Attorney, Agent, or Firm* — Armis IP Law, LLC

(57) ABSTRACT

An apparatus such as a DC-DC power converter including a switch, an ON-time controller, and a compensator operates in a constant ON-time control mode. Over multiple control cycles, the ON-time controller controls an ON-time duration of activating the switch and generation of an output voltage to power a dynamic load. The compensator, in communication with the ON-time controller, adjusts the ON-time duration of activating the switch depending on a magnitude of output current delivered by the output voltage to the dynamic load. For example, during heavier load conditions when the dynamic load consumes a higher amount of current, and in which internal resistive losses of the power supply become more substantial, the compensator increases the ON-time duration of activating the switch, resulting in operation of the power supply and switch closer to a desired frequency setpoint.

39 Claims, 11 Drawing Sheets

(56) References Cited

OTHER PUBLICATIONS

Chen Wei-Chung et al: "A psuedo fixed switching frequency 2kHz/A in optimum on-time control buck converter with predicting correction technique for EMI solution", 2014 IEEE International Symposium on Circuits and Systems (ISCAS) IEEE, Jun. 1, 2014 (Jun. 1, 2014), pp. 946-949, XP03264811.
Extended Search Report, EP 20 20 1386, dated Feb. 19, 2021, pp. 1-10.
Li Qinqin et al: "Adaptive current-threshold detector for an adaptive on-time Buck converter at light load", Analog Integrated Circuits and Signal Processing, Springer New York, LLC, US, vol. 95, No. 3. Mar. 1, 2018 (Mar. 1, 2018), pp. 541-549, XP036499028.

* cited by examiner

DATA 510

| Targeting switching frequency | fsw @ 3A (kHz) | fsw @ 30A (kHz) | Frequency Variation over load (kHz) | error (3A) | error (30A) | error |
|---|---|---|---|---|---|---|
| 400kHz | 388.4 | 423.16 | 34.76 | -2.90% | 5.79% | -8.69% |
| 600kHz | 573.36 | 619.62 | 46.26 | -4.44% | 3.27% | -7.71% |
| 800kHz | 749.76 | 824 | 74.24 | -6.28% | 3.00% | -9.28% |
| 1MHz | 928.9 | 1018.5 | 89.6 | -7.11% | 1.85% | -8.96% |
| 1.2MHz | 1090.3 | 1206.36 | 116.16 | -9.15% | 0.53% | -9.68% |
| 1.4MHz | 1253.56 | 1385.02 | 131.46 | -10.46% | -1.07% | -9.39% |
| 1.8MHz | 1575.54 | 1741.86 | 166.32 | -12.47% | -3.23% | -9.24% |
| 2.0MHz | 1727.6 | 1901.8 | 174.2 | -13.62% | -4.91% | -9.71% |

DATA 520

| Targeting switching frequency | fsw @ 3A (kHz) | fsw @ 30A (kHz) | Frequency Variation over load (kHz) | error (3A) | error (30A) | error |
|---|---|---|---|---|---|---|
| 400kHz | 368 | 389 | 21 | -8.00% | -2.75% | -5.25% |
| 600kHz | 563 | 590 | 27 | -6.17% | -1.67% | -4.50% |
| 800kHz | 757 | 794 | 37 | -5.38% | -0.75% | -4.63% |
| 1MHz | 953 | 998 | 45 | -4.70% | -0.20% | -4.50% |
| 1.2MHz | 1149 | 1202 | 53 | -4.25% | 0.17% | -4.42% |
| 1.4MHz | 1338 | 1427 | 89 | -4.43% | 1.93% | -6.36% |
| 1.8MHz | 1756 | 1876 | 120 | -2.44% | 4.22% | -6.67% |
| 2.0MHz | 1944 | 2095 | 151 | -2.80% | 4.75% | -7.55% |

FIG. 5

ON-TIME COMPENSATION IN A POWER CONVERTER

BACKGROUND

Conventional buck converters convert an input voltage into an output voltage. Certain instances of such power converter circuits include control circuitry that controls an ON-time of a switch in a buck converter.

As an example, a conventional constant ON-time generator circuit is an open loop system in which the ON-time pulse duration of a corresponding switch in the power converter circuit is a function of a respective input voltage and output voltage. When a PWM pulse trigger occurs, a Ton_done signal determines the duration of the respective "ON" pulse produced by the controller. In the traditional method, the Ton_done is generated as a function of both input and output voltage. Any number of switches in the constant ON-time signal generator control an amount of current to charge a respective capacitor. As the voltage on the capacitor increases to above a threshold value, the Ton_done signal is asserted to a high state, resetting the ON-time pulse for the next PWM cycle.

BRIEF DESCRIPTION

Conventional techniques of generating a constant ON-time duration of a control switch suffer from deficiencies. For example, a switching power supply can be configured to operate at a desired switching frequency that provides a best overall efficiency. Unfortunately, due to resistive losses in the power supply (such as switch losses, DCR losses in an inductor, etc.), changes in current consumption by a load increases internal voltage losses in the power supply, causing an undesirable frequency shift with respect to the desired frequency set point of operating the power supply in a constant ON-time control mode. Operating the power supply at the shifted frequency, without compensation, results in lower efficiency voltage conversion from an input voltage to an output voltage.

Embodiments herein include novel ways of improving an efficiency of generating an output voltage and addressing deficiencies of conventional power converters.

More specifically, embodiments herein include an apparatus comprising: a switch, an ON-time controller, and a compensator. Activation of the switch generates an output voltage that powers a dynamic load. For each of multiple control cycles, the ON-time controller controls an ON-time duration of activating the switch and generation of the output voltage. In one embodiment, the compensator is in communication with the ON-time controller. The compensator adjusts the ON-time duration of activating the switch depending on a magnitude of output current delivered by the output voltage to the dynamic load.

In one embodiment, adjustment to the ON-time duration as controlled by the compensator adjusts frequency operation, improving an efficiency of generating a respective output voltage. For example, the adjustments to the ON-time duration of the switch reduces occurrence of a frequency shift with respect to a desired operating setpoint such as when producing the output voltage during constant ON-time control operation of the switch. In other words, during heavy load conditions when a dynamic load consumes a large amount of current above a threshold value, during which the power converter experiences substantial internal voltage drops, the compensator increases the ON-time duration of activating the switch to operate the power converter nearer a desired setpoint frequency. Such compensation results in moreover efficient conversion (such as lower losses) of converting an input voltage into a respective output voltage.

In accordance with further embodiments, the compensator is operative to produce an adjustment signal inputted to the ON-time controller. In one embodiment, the adjustment signal increases the ON-time duration produced by the ON-time controller. Increased ON-time duration of the switch results in decreasing a switching frequency of activating the switch (such as high-side or control switch) in a constant ON-time control mode over multiple control cycles.

In still further example embodiments, the apparatus as described herein includes a power converter circuit (such as a DC-DC voltage converter) in which the switch and constant ON-time controller reside. The adjusted ON-time duration provides frequency compensation of controlling the respective switch.

In accordance with yet further embodiments, the ON-time controller includes a first input and a second input, the first input receives an input voltage; the second input receives the output voltage. The ON-time controller produces the ON-time duration of controlling the switch based on a magnitude of the input voltage and a magnitude of the output voltage.

In yet further embodiments, the power converter circuit is operative to power the dynamic load over a current consumption range. For example, in one embodiment, the compensator increases a magnitude of the ON-time duration in response to detecting an increase in the current consumption by the dynamic load. The increased constant ON-time duration reduces a switching frequency of activating the switch to generate the output voltage.

In accordance with further embodiments herein, the apparatus as described herein includes a current monitor resource that monitors a magnitude of the current delivered to the dynamic load via the output voltage. In one embodiment, the monitor resource produces a signal representing the detected magnitude of the current delivered to the load. The monitor resource outputs the signal indicative of current consumption to the compensator, which in turn uses the detected magnitude of the current as a basis to adjust the duration of the constant ON-time control signal driving the switch.

In yet further embodiments, the ON-time controller and corresponding circuit as described herein further includes a capacitor and a current source that supplies current to the capacitor. The supplied current causes generation of a ramp voltage on a node of the capacitor. In one embodiment, the current supplied by current source produces a ramp voltage on the capacitor. The corresponding circuit further includes a comparator that compares the ramp voltage of the capacitor to a threshold value. The compensator, based on the magnitude of the supply current, inputs the corresponding generated compensation signal to a node of the capacitor during the ramping. In one embodiment, the compensator outputs a signal (a drain current) to the node of the capacitor storing the ramp voltage. Thus, the compensation signal produced by the compensator can be configured to sink current from capacitor while the capacitor voltage is ramping. The drain current associated with the compensation signal applied to the capacitor reduces a rate at which the ramp voltage increases in magnitude over time. Because the ON-time controller produces the ON-time duration of driving the switch based on the ramp rate, and the ramp voltage reaching a threshold value, the reduced rate of ramping the voltage on the capacitor increases a respective ON-time duration of driving the respective control switch in the power converter circuit.

Note further that the current source supplying current to produce the ramp voltage on the capacitor can be configured to control a magnitude of the current supplied to the capacitor based on any suitable parameters. For example, in one embodiment, the ON-time controller and corresponding current source produces the ON-time duration as a function of both the input voltage and the output voltage.

In yet further example embodiments, activation of the switch in the power converter circuit for the ON-time duration provides a low impedance path between an input voltage of the power converter circuit and an inductor that produces the output voltage.

Embodiments herein are useful over conventional techniques. For example, the compensator as described herein provides compensation to an ON-time controller resulting in switching operation of a switch (controlled in accordance with a constant ON-time control mode) closer to a desired setpoint frequency of a power supply over a range of different currents supplied to a dynamic load.

These and other more specific embodiments are disclosed in more detail below.

Note that techniques as discussed herein can be implemented in any suitable environment such as amplifier circuitry, power supplies, multi-phase power supply applications, single phase point of load (a.k.a., POL) power supply applications, etc.

Note further that although embodiments as discussed herein are applicable to multi-phase power supply circuits such as those implementing buck converters, DC-DC converter phases, the concepts disclosed herein may be advantageously applied to any other suitable topologies as well as general power supply control applications.

Additionally, note that embodiments herein can include computer processor hardware (that executes corresponding switch instructions) to carry out and/or support any or all of the method operations disclosed herein. In other words, one or more computerized devices or processors (computer processor hardware) can be programmed and/or configured to operate as explained herein to carry out different embodiments of the invention.

Yet other embodiments herein include software programs to perform the steps and operations summarized above and disclosed in detail below. One such embodiment comprises a computer program product that has non-transitory computer-storage media (e.g., memory, disk, flash, . . . ) including computer program instructions and/or logic encoded thereon that, when performed in a computerized device having a processor and corresponding memory, programs the processor to perform any of the operations disclosed herein. Such arrangements are typically provided as software instructions, code, and/or other data (e.g., data structures) arranged or encoded on a computer readable storage medium or non-transitory computer readable media such as an optical medium (e.g., CD-ROM), floppy or hard disk or other a medium such as firmware or microcode in one or more ROM or RAM or PROM chips, an Application Specific Integrated Circuit (ASIC), circuit logic, etc. The software or firmware or other such configurations can be installed onto a respective controller circuit to cause the controller circuit (such as logic) to perform the techniques explained herein.

Accordingly, one embodiment of the present disclosure is directed to a computer program product that includes a computer readable medium having instructions stored thereon for supporting operations such as controlling one or more phases in a power supply. For example, in one embodiment, the instructions, when carried out by computer processor hardware (one or more computer devices, control logic, digital circuitry, etc.), cause the computer processor hardware to: receive input indicating a magnitude of output current supplied by an output voltage to a dynamic load; adjust an ON-time duration in which to activate a switch in a power converter depending on the magnitude of the output current supplied to the dynamic load via the output voltage; and activate the switch for the adjusted ON-time duration, the activation of the switch producing the output voltage that powers the dynamic load.

The ordering of the operations has been added for clarity sake. The operations can be performed in any suitable order.

It is to be understood that the system, method, device, apparatus, logic, etc., as discussed herein can be embodied strictly as hardware (such as analog circuitry, digital circuitry, logic, etc.), as a hybrid of software and hardware, or as software alone such as within a processor, or within an operating system or a within a software application.

Note that although each of the different features, techniques, configurations, etc., herein may be discussed in different places of this disclosure, it is intended, where appropriate, that each of the concepts can optionally be executed independently of each other or in combination with each other. Accordingly, the one or more present inventions as described herein can be embodied and viewed in many different ways.

Also, note that this preliminary discussion of embodiments herein purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section and corresponding figures of the present disclosure as further discussed below.

BRIEF DESCRIPTION OF THE DRAWINGS

FIG. 5 is an example chart illustrating a frequency variation before and after applying compensation according to embodiments herein.

Figure 1:
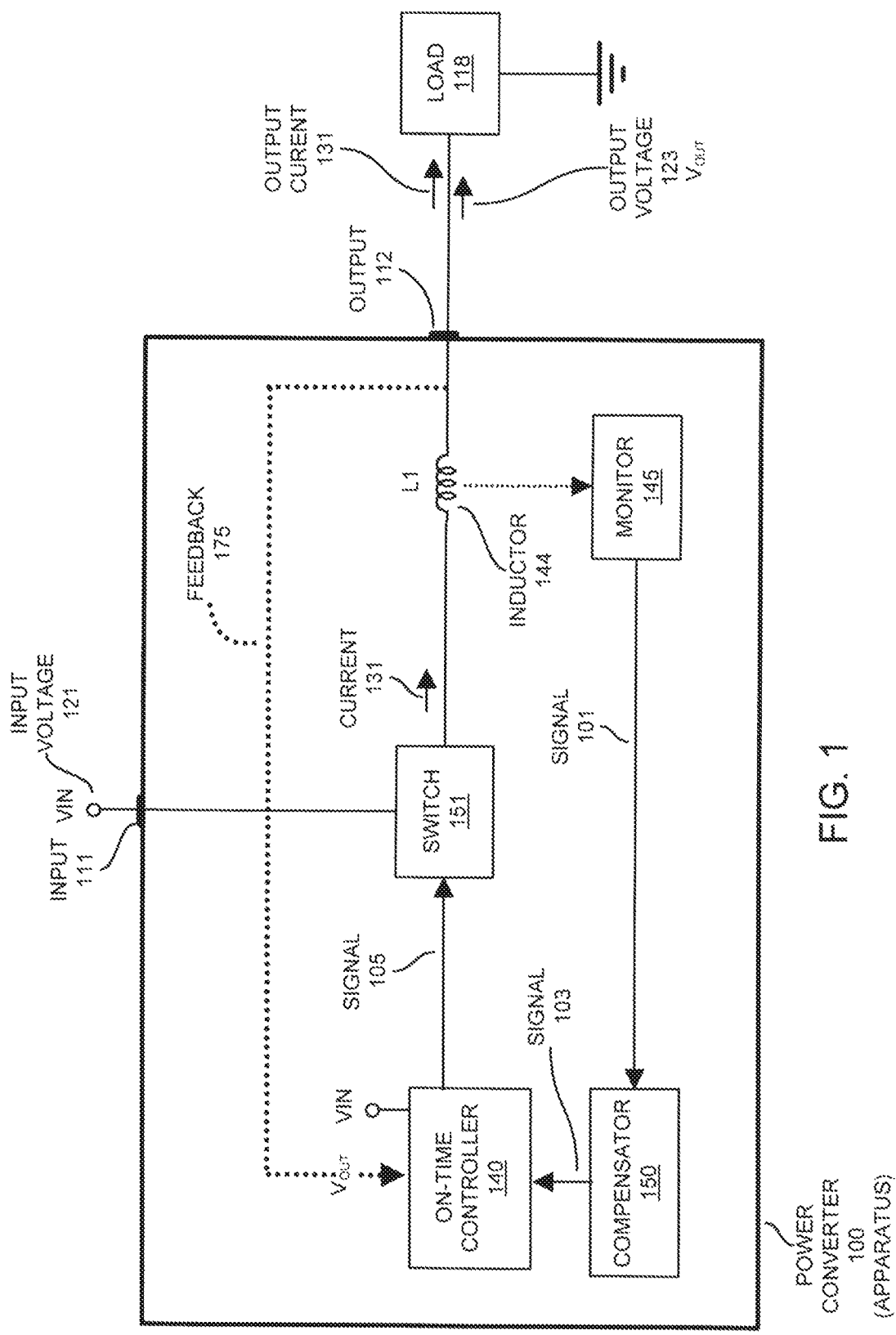
FIG. 1 is an example diagram illustrating a power converter including a compensator according to embodiments herein.

The foregoing and other objects, features, and advantages of embodiments will be apparent from the following more particular description of preferred embodiments herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

According to example embodiments, an apparatus such as a DC-DC power converter (including a switch, an ON-time controller, and a compensator) operates in a constant ON-time control mode. Over multiple control cycles, the ON-time controller controls an ON-time duration of activating the switch and generation of an output voltage to power a dynamic load. The compensator, in communication with the ON-time controller, adjusts the ON-time duration of activating the switch depending on a magnitude of output current delivered by the output voltage to the dynamic load. For example, during heavier load conditions when the dynamic load consumes a higher amount of current, and in which internal resistive losses of the power supply become more substantial, the compensator increases the ON-time duration of activating the switch, resulting in operation of the power supply and switch closer to a desired frequency setpoint.

Now, more specifically, FIG. 1 is an example diagram illustrating a power converter including a compensator according to embodiments herein.

As shown, the power converter 100 includes an interconnection of (current) monitor 145, compensator 150, on-time controller 140, switch 151, and inductor 144.

The power converter 100 (a.k.a., apparatus) includes input 111 (first port) to receive input voltage 121 from voltage source, Vin. The power converter 100 includes output 112 (second port) to output respective output voltage 123 (Vout) and corresponding current 131 that powers dynamic load 118.

In one embodiment, the feedback 175 feeds back the output voltage 123 from the output of inductor 144 (L1) to the ON-time controller 140. ON-time controller 140 also receives input voltage (Vin).

In general, during operation, repeated switching of switch 151 in the power converter 100 between ON and OFF over multiple control cycles causes current to flow from the voltage source 121 through the switch 151 and corresponding inductor 144 to the dynamic load 118. Thus, repeated cycles of activating and deactivating the switch 151 generates the output voltage 123 and corresponding current 131 that powers the dynamic load 118.

Embodiments herein include providing compensation input such as signal 103 to the ON-time controller 140 to adjust an ON-time duration of activating the switch 151 for a given control cycle. For example, in one embodiment, the dynamic load 118 consumes different amounts of current over time. As its name suggests, the (current) monitor resource 145 monitors current flow through the inductor 144 or other suitable component, path, etc., in the power converter 100 and produces output signal 101 indicating a respective magnitude of the output current 131 delivered to the load 118.

Note that the monitor resource can be configured to measure a magnitude of the output current 131 in any suitable manner. For example, the current can be measured via internal MOSFET (Metal-Oxide-Semiconductor Field-Effect Transistor) Rds=ON type sensing, using mirror MOSFETs, external RC parallel methods, etc. Thus, measurement of output current 131 can be implemented via integrated current (internal) sensing methods or externally at the PCB (printed Circuit Board) level.

In one non-limiting example embodiment, as its name suggests, the ON-time controller 140 controls an ON-time duration of activating the switch 151 and corresponding generation of the output voltage 123 based at least in part on the signal 101 generated by the monitor 145 indicating a magnitude of the output current 131. More specifically, as further shown, the compensator 150 is in communication with the ON-time controller 140 and receives signal 101 from the monitor resource 145 indicating the magnitude of the current 131. Based on the received signal 101, the compensator 150 generates compensation signal 103 inputted to the ON-time controller 140. As discussed herein, the compensation signal 103 adjusts the ON-time duration associated with activating the switch 151 based on a magnitude of current 131 consumption by the dynamic load 118. In one embodiment, the ON-time controller 140 controls the ON-time duration of activating the switch 151 based on a combination of Vin, Vout, and signal 103.

In this manner, the compensator 150 and ON-time controller 140 collectively operate to adjust the ON-time duration of activating the switch 151 depending on a magnitude of the output current 131 delivered by the output voltage 123 to the dynamic load 118.

In one embodiment, the adjustment to the ON-time duration as controlled by the compensator 150 and the ON-time controller 140 results in adjustment or control of the frequency operation as well as ON-time duration of the switch 151, improving an efficiency of generating the output voltage 123. For example, in one embodiment, the adjustments to the ON-time duration of the switch (as captured by control signal 105) reduces occurrence of a frequency shift from a desired operating setpoint of the power converter 100.

As a more specific example, during heavy load conditions when the dynamic load 118 consumes a large amount of current 131 such as above a threshold value, the power converter 100 experiences substantial internal voltage drops due to the high amount of current passing through resistive components of the power converter 100. Source of internal voltage loss can be due to the resistance of the switch 151, DC resistance of the inductor device 144, resistance of circuit paths, etc.). As further discussed below, during such high output current 131 conditions, to accommodate for the internal error voltage losses, the compensator 150 in conjunction with the ON-time controller 140 increases the ON-time duration of activating the switch 151 to operate the power converter 100 nearer a desired setpoint frequency, resulting in more efficient conversion (such as lower losses) of converting an input voltage 121 (from source Vin) into a respective output voltage 123. In other words, the adjustment causes the switching of the switch 151 to be closer to a desired switching frequency.

Figure 2:
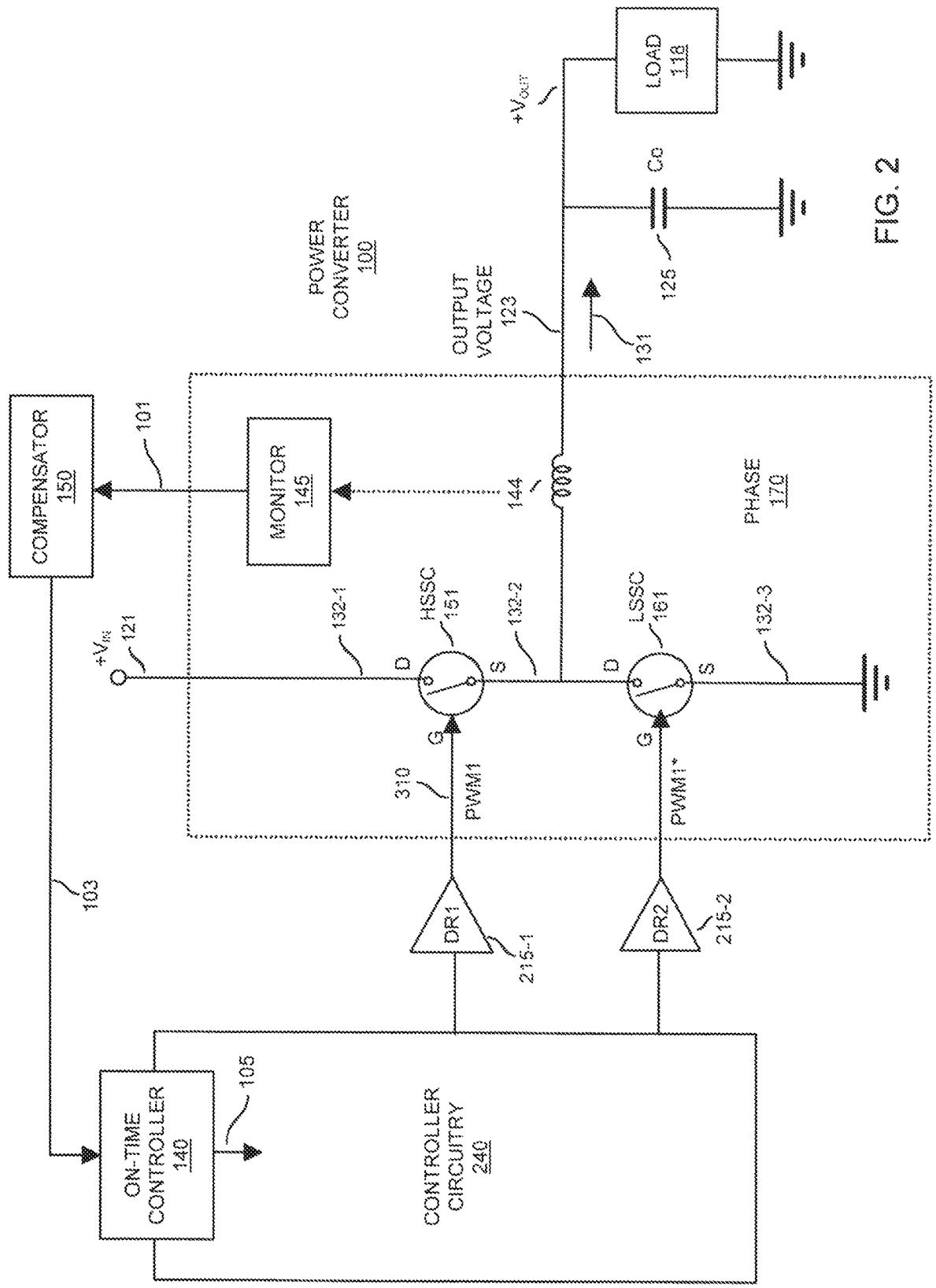
FIG. 2 is an example diagram illustrating a power converter phase controlled by a ON-time controller according to embodiments herein.

FIG. 2 is an example diagram illustrating a power converter phase controlled by an ON-time controller according to embodiments herein.

In this example embodiment, the power converter 100 (such as a phase in a power supply) includes monitor 145, compensator 150, ON-time controller 140, controller circuitry 240, driver 215-1, driver 215-2, switch 151 (a.k.a., high side switch circuitry), switch 161 (such as low side switch circuitry), inductor 144, and output capacitor 125.

As shown, the compensator 150 is coupled to receive signal 101 from the monitor 145; ON-time controller 140 is coupled to receive signal 103 from the compensator 150. The ON-time controller 140 associated with the controller circuitry 240 produces control signal 105 inputted to the corresponding driver 215-1. Driver 215-1 controls operation of switch 151; driver 215-to controls operation of switch 161. The control signal 105 controls operation of switch 151.

Yet further, the combination of switch 151 and switch 161 are coupled in series between the input voltage and a ground reference voltage.

For example, the drain node (D) such as node 132-1 of the switch 151 is coupled to the input voltage source, Vin. The source node (S) of switch 161 such as node 132-3 is coupled to a ground reference. The source node (S) of the switch 151 is connected to the drain node (D) of the switch 161 at corresponding node 132-2.

Inductor 144 is coupled between the node 132-2 and the output 112 of the power converter 100.

The output capacitor 125 is coupled between the output of inductor 144 and ground. As previously discussed, the output of the inductor 144 is connected to the load 118.

In one embodiment, the power converter 100 operates in a constant on-time control mode in which the controller circuitry 240 and corresponding ON-time controller 140 generate respective ON-time pulses for a respective ON-time duration over each of multiple control cycles to maintain the magnitude of the output voltage 123 in regulation such as within a desired voltage range.

Figure 3:
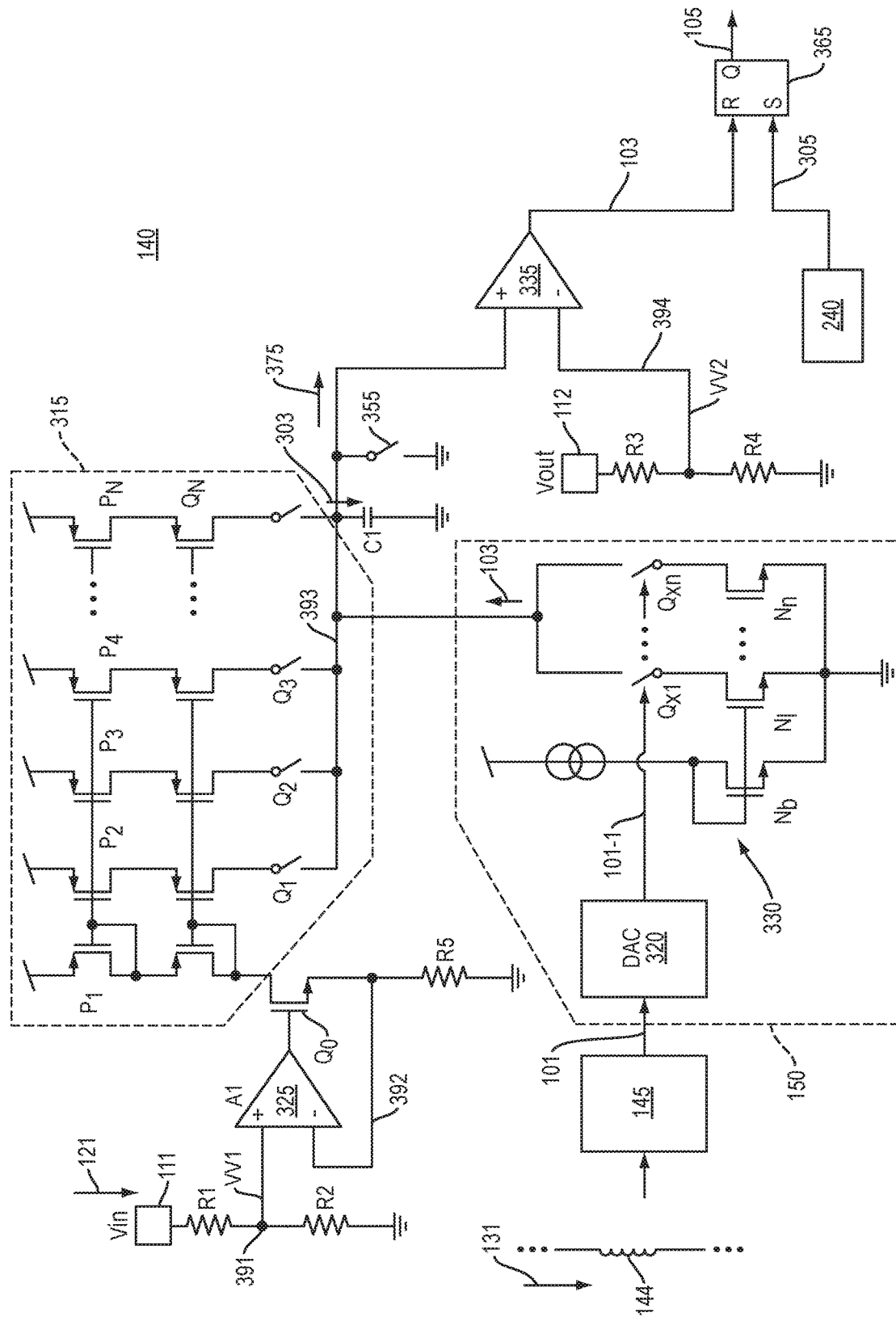
FIG. 3 is an example diagram illustrating an ON-time controller and corresponding components in a power converter circuit according to embodiments herein

FIG. 3 is an example diagram illustrating an ON-time controller according to embodiments herein.

As shown in example of FIG. 3, the ON-time controller 140 can be configured to include multiple resistors R1, R2, R3, R4, and R5), amplifier 325, switch Q0, current digital-to-analog converter 315 including multiple switches (Q1, Q2, Q3, ..., Qn, P1, P2, P3, ..., Pn), capacitor C1, voltage reset switch 355, comparator 335, and buffer 365 (such as an S-R flip-flop). In this example embodiment, compensator 150 includes digital-to-analog converter 320 and current sink resource 330. Current sink resource 330 includes multiple switches Qx1 . . . Qxn, Nb, N1 . . . Nn.

As further shown, resistor R1 and R2 are connected in series. Node 391 is set to a voltage value VV1 equal to [R2/(R1+R2)]×Vin. The voltage value VV1 at node 391 is inputted to the non-inverting input node of the amplifier 325. The non-inverting input of amplifier is coupled to node 392. Resistor R5 is connected between the output of switch Q0 (node 392) and ground. Thus, the inverting input of the amplifier 325 is coupled to the node 392 between the switch Q0 and resistor R5. A combination of amplifier 325 and switch Q0 controls operation of the current digital-to-analog converter 315.

During operation, the current digital-to-analog converter 315 produces an output current 303 that produces a ramp voltage 375 at node 393 of the capacitor C1. For example, a combination of amplifier 325, resistor R5, switch Q0 and current digital-to-analog converter 315 is a voltage to current converter. The magnitude of the current 303 outputted from the current digital-to-analog converter 315 varies in relation to the input voltage and corresponding voltage VV1 at node 391.

According to further operation, compensator 150 receives signal 101 from the monitor resource 145 and produces a respective signal 103. Recall that signal 101 indicates an amount of current 131 supplied to the dynamic load 118.

In one embodiment, the digital-to-analog converter 320 converts the received signal 101 into an analog signal 101-1 that drives sink current resource 330. As its name suggests, via generation of signal 103, the sink current resource 330 sinks current from the capacitor C1. In one embodiment, the signal 103 sinks current from the node 393 to ground.

Based on signal 101-1 as input, the sink current resource 330 produces signal 103, magnitude of which varies depending on a magnitude of the signal 101 (representative of a magnitude of the current 131 through inductor 144).

For example, when the magnitude of the current 131 through inductor 144 is low, the magnitude of the amount of current sunk to ground by the signal 103 is low as well. When the magnitude of the current 131 is high, the magnitude of the amount of current sunk to ground by the signal 103 is high as well. In this manner, depending on a magnitude of the sink current associated with signal 103, the compensator 101 controls a ramp rate of generating the ramp voltage 375.

ON-time controller produces the control signal 105 based on a comparison of the ramp voltage 375 on capacitor C1 and threshold value VV2. For example, the inverting input node of comparator 335 receives voltage VV2 from voltage divider R3 and R4, where the voltage VV2 equals [R4/(R3+R4)]×Vout (123).

The non-inverting input node of comparator 335 receives the ramp voltage 375.

Comparator 335 compares the magnitude of the ramp voltage 375 inputted to the voltage VV2 (threshold value) inputted to the voltage VV2 at the non-inverting input node of the comparator.

At a start of a generating the ON-time duration (signal 105), the controller produces signal 305 to set the output signal 105 of the buffer 365 to a logic high state. At such time, the switch 355 is controlled to set to an open state. The switch 151 is closed to provide a low impedance path between the input voltage 121 and the inductor 144 (FIG. 2). The ramp voltage 375 starts to increase based on a combination of current 303 (less an amount of sink current caused by compensation signal 103). When a magnitude of the ramp voltage 375 equals or exceeds a magnitude of the threshold value VV2, the comparator 335 controls the state of signal 103 to reset the buffer 365 to a logic zero, ending the respective ON-time duration of controlling the switch 151 to the ON state.

Figure 4:
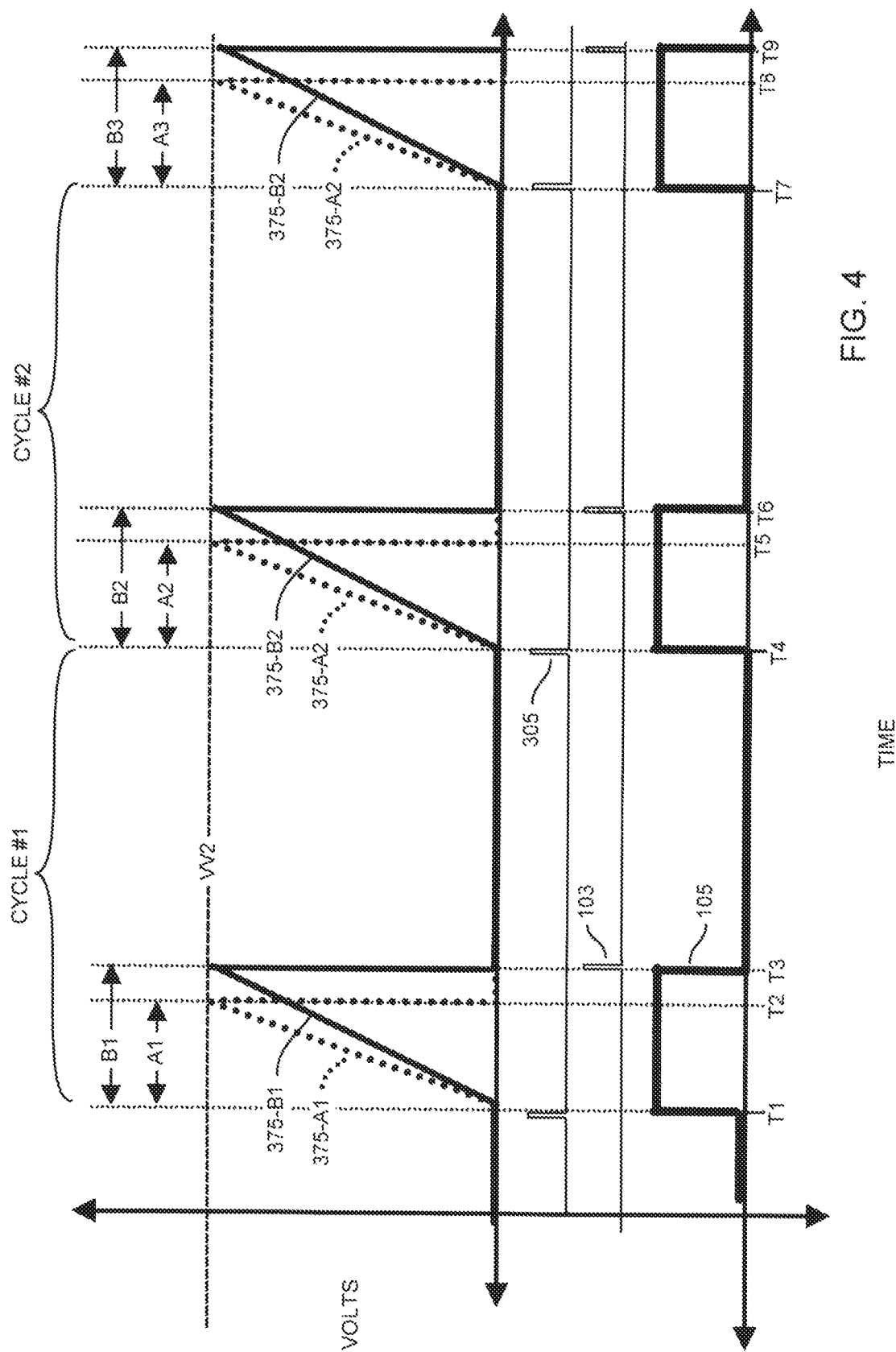
FIG. 4 is an example timing diagram illustrating modification of a constant ON-time duration based on current consumption according to embodiments herein.

A further illustrative example of the implementing compensation via compensator 150 is shown in FIG. 4.

FIG. 4 is an example timing diagram illustrating modification of a constant ON-time duration based on current consumption according to embodiments herein.

This example embodiment illustrates how the compensation signal 103 produced by the compensator 150 adjusts the constant ON-time duration of signal 105 generated by the ON-time controller 140 over multiple control cycles (such as cycle #1, cycle #2, etc.).

For example, assume that the current consumed by the dynamic load 118 is below a threshold value of 3.1 amps. In such an instance, the compensation signal 103 (sink current) is very low or zero. At time T1, the controller 240 generates signal 305 to set the signal 105 to a high state. This causes the ramp voltage 375-A1 to increase in magnitude from 0 volts. At time T2, the comparator 335 senses that the magnitude of the ramp voltage 375-A1 becomes greater than the threshold voltage VV2 and generates signal 103 to reset the buffer 365 causing the switch to shut off at time T2. In such an instance, the ON-time duration A1 (such as when the signal 105 is in a high state controlling switch 151 ON) is the difference between time T2 and time T1.

Alternatively, assume that the current consumed by the dynamic load 118 is above a threshold value of 29 amps. In such an instance, the compensation signal 103 (sink current) is relatively high. As previously discussed, the signal 103 sinks current from the capacitor C1. This reduces the rate at which the ramping voltage ramps up from 0 volts to the threshold voltage VV2. As previously discussed, at time T1, the controller 240 generates signal 305 to set the signal 105 to a high state. This causes the ramp voltage 375-A1 to increase. At time T3, the comparator 335 senses that the magnitude of the ramp voltage 375-B1 becomes greater than the threshold voltage VV2. In such an instance, the ON-time duration B1 (such as when the signal 105 is in a high state) is the difference between time T3 and time T1. The ON-time duration B1 is greater than ON-time duration A1 because the compensation signal 103 (sinking current) slows a rate of the ramping the ramp voltage 375.

In this manner, during each of the multiple control cycles, the compensator 150 adjusts the ON-time duration depending upon the magnitude of the current 131 consumed by the dynamic load 118. More specifically, when the current 131 consumed by the respective dynamic load 118 is low, the adjustment via compensation signal 103 to the ON-time duration (A1, A2, etc.) is minimal or 0 (because the compensation signal sinks no current). Conversely, when the current 131 consumed by the respective dynamic load 118 is at a high-end of a consumption range, the adjustment to the ramp voltage 375 via compensation signal 103 causes the ON-time duration (B1, B2, etc.) to increase.

As further shown in the following figures, increasing the ON-time duration of the signal 105 for higher current 131 consumption by the load 118 results in maintaining switching operation of the switch 150 nearer to a desired setpoint frequency.

Note that the amount of sink current applied by the signal 103 to the capacitor C1 can vary depending on the embodiment. For example, in one embodiment, the amount of current sunk by the compensator 150 is a percentage of the current 303 supplied by the current digital-to-analog converter 315 to charge the capacitor C1. If a frequency shift of 5% is desired for higher loads, the compensator produces the signal 103 to sink 5% of the current 303 to ground, resulting in an increase in the ON-time duration by approximately 5%. This decreases the actual switching frequency of controlling the switch by around 5% so that it is closer to a desired switching frequency setpoint.

FIG. 5 is an example chart illustrating a frequency variation before and after applying compensation according to embodiments herein.

Operation of Power Converter 100 without Compensation
In this example embodiment, the data 510 illustrates a switching frequency associated with controlling switch 151 without any compensation as illustrated by ON-time durations A1, A2, A3, etc., in FIG. 4.

In general, data 510 illustrates the deficiency of operating the power converter 100 without any compensation to the generated ON-time durations A1, A2, A3, etc.

Column 551 of data 510 (without compensation) in FIG. 5 indicates different possible selectable setpoints of a switching frequency associated with the power converter 100. The switching frequency setpoint is selected based on parameters of the power converter 100 such as a magnitude of the inductor 144, amount of current to be supplied to the dynamic load 118, etc.

As previously discussed, although the power converter 100 is configured to operate at a selected switching frequency, the actual switching frequency at which the power converter operates varies depending on the amount of current supplied to the dynamic load 118.

Columns 552, 553, 554, 555, 556, and 557 illustrate quantification of frequency variation and error associated with operating the power converter 100 without compensation provided by compensator 150.

More specifically, column 552 of data 510 (without compensation) indicates an actual frequency operation of the power converter 100 at each of the different switching frequency settings for low current 131 consumption by dynamic load 118 such as 3 amperes.

Column 553 of data 510 (without compensation) indicates an actual switching frequency operation of the power converter 100 at the different switching frequency settings for high current 131 consumption by dynamic load 118 such as 30 amperes.

Column 554 of data 510 (without compensation) indicates a variation in the actual switching frequency between a respective low current 131 consumption condition and a high current consumption condition. For example, the switching frequency variation of operation for the 400 KHz setting varies between 388.4 KHz and 423.6 KHz for different load conditions resulting in 34.76 KHz; the switching frequency variation of operation for the 600 KHz setting varies between 573.36 KHz and 619.62 KHz for different load conditions resulting in a variation of 46.26 KHz; and so on.

Column 555 of data 510 (without compensation) indicates an amount of switching frequency error between the actual frequency operation for the dynamic load 118 at low load conditions (output current 131 equals 3 Amps) and a respective desired switching frequency. For example, the switching frequency value 388.4 KHz for 3 ampere (current 131) is 2.90% below the corresponding desired switching frequency of 400 KHz; the switching frequency value 573.36 KHz for 3 ampere (current 131) is 4.44% below the corresponding desired switching frequency of 600 KHz; the switching frequency value 749.76 KHz for 3 ampere (current 131) is 6.28% below the corresponding desired switching frequency of 800 KHz; and so on.

Column 556 of data 510 (without compensation) indicates an amount of switching frequency error between the actual frequency operation for the dynamic load 118 at high load conditions (output current 131 equals 30 Amps) and a respective desired switching frequency. For example, the switching frequency value 423.16 KHz for 30 ampere (current 131) is 5.79% above the corresponding desired switching frequency of 400 KHz; the switching frequency value 619.62 KHz for 30 ampere (current 131) is 3.27% above the corresponding desired switching frequency of 600 KHz; the switching frequency value 824 KHz for 30 ampere (current 131) is 3.00% above the corresponding desired switching frequency of 800 KHz; and so on.

Column 557 of the data (without compensation) indicates a magnitude of variation of actual switching of the switch 151 in the power converter 100 between low and high current consumption loads. For example, the actual switching frequency of operating switch 151 varies by 8.69% over different current 131 consumption conditions; the actual switching frequency of operating switch 151 varies by 7.71% over different current 131 consumption conditions;

the actual switching frequency of operating switch 151 varies by 9.28% over different current 131 consumption conditions; and so on.

Operation of Power Converter 100 with Compensation

Data 520 illustrates results of providing compensation via compensator 150 to operate the power converter 100 nearer to a desired setpoint switching frequency.

More specifically, column 551 of data 520 in FIG. 5 (with compensation such as an amount of sink current applied to capacitor C1 in FIG. 3) indicates different possible selectable setpoints of a switching frequency associated with the power converter 100. The switching frequency setpoint is selected based on parameters of the power converter 100 such as a magnitude of the inductor 144, amount of current to be supplied to the dynamic load 118, etc.

Further, as previously discussed, although the power converter 100 is configured to operate at a selected switching frequency, the actual switching frequency at which the power converter 100 operates varies depending on the amount of current supplied to the dynamic load 118.

Columns 552, 553, 554, 555, 556, and 557 illustrate quantification of frequency variations and error associated with operating the power converter 100 with compensation provided by compensator 150.

More specifically, column 552 of data 520 (with compensation) indicates an actual switching frequency operation of the power converter 100 at the different switching frequency settings for low current 131 consumption by dynamic load 118 (such as 3 amperes).

Column 553 of data 520 (with compensation) indicates an actual frequency operation of the power converter 100 at the different switching frequency settings for high current 131 consumption by dynamic load 118 such as 30 amperes.

Column 554 of data 520 (with compensation as previously discussed) indicates a variation in the actual switching frequency between a respective low current 131 consumption condition and a high current consumption condition. For example, the switching frequency variation of operation for the 400 KHz setting varies between 368 KHz and 389 KHz for different load conditions resulting in a switching variation of 21 KHz; the switching frequency variation of operation for the 600 KHz setting varies between 563 KHz and 590 KHz for different load conditions resulting in a switching frequency variation of 27 KHz; and so on.

Column 555 of data 520 (with compensation) indicates an amount of switching frequency error between the actual frequency operation for the dynamic load 118 at low load conditions (output current 131 equals 3 Amps) and a respective desired switching frequency. For example, the switching frequency value 368 KHz for 3 ampere (current 131) is −8.0% below the corresponding desired switching frequency of 400 KHz; the switching frequency value 563 KHz for 3 ampere (current 131) is 6.17% below the corresponding desired switching frequency of 600 KHz; the switching frequency value 757 KHz for 3 ampere (current 131) is 5.38% below the corresponding desired switching frequency of 800 KHz; and so on.

Column 556 of data 520 (with compensation) indicates an amount of switching frequency error between the actual frequency operation for the dynamic load 118 at high load conditions (output current 131 equals 30 Amps) and a respective desired switching frequency. For example, the switching frequency value 389 KHz for 30 ampere (current 131) is 2.75% below the corresponding desired switching frequency of 400 KHz; the switching frequency value 590 KHz for 30 ampere (current 131) is 1.67% below the corresponding desired switching frequency of 600 KHz; the switching frequency value 794 KHz for 30 ampere (current 131) is 0.75% below the corresponding desired switching frequency of 800 KHz; and so on.

Column 557 of data 520 (with compensation) indicates a magnitude of variation of actual switching of the switch 151 in the power converter 100 between low and high current consumption loads. For example, the actual switching frequency of operating switch 151 varies by 5.25% over different current 131 consumption conditions; the actual switching frequency of operating switch 151 varies by 4.5% over different current 131 consumption conditions; the actual switching frequency of operating switch 151 varies by 4.63% over different current 131 consumption conditions; and so on.

Figure 6:
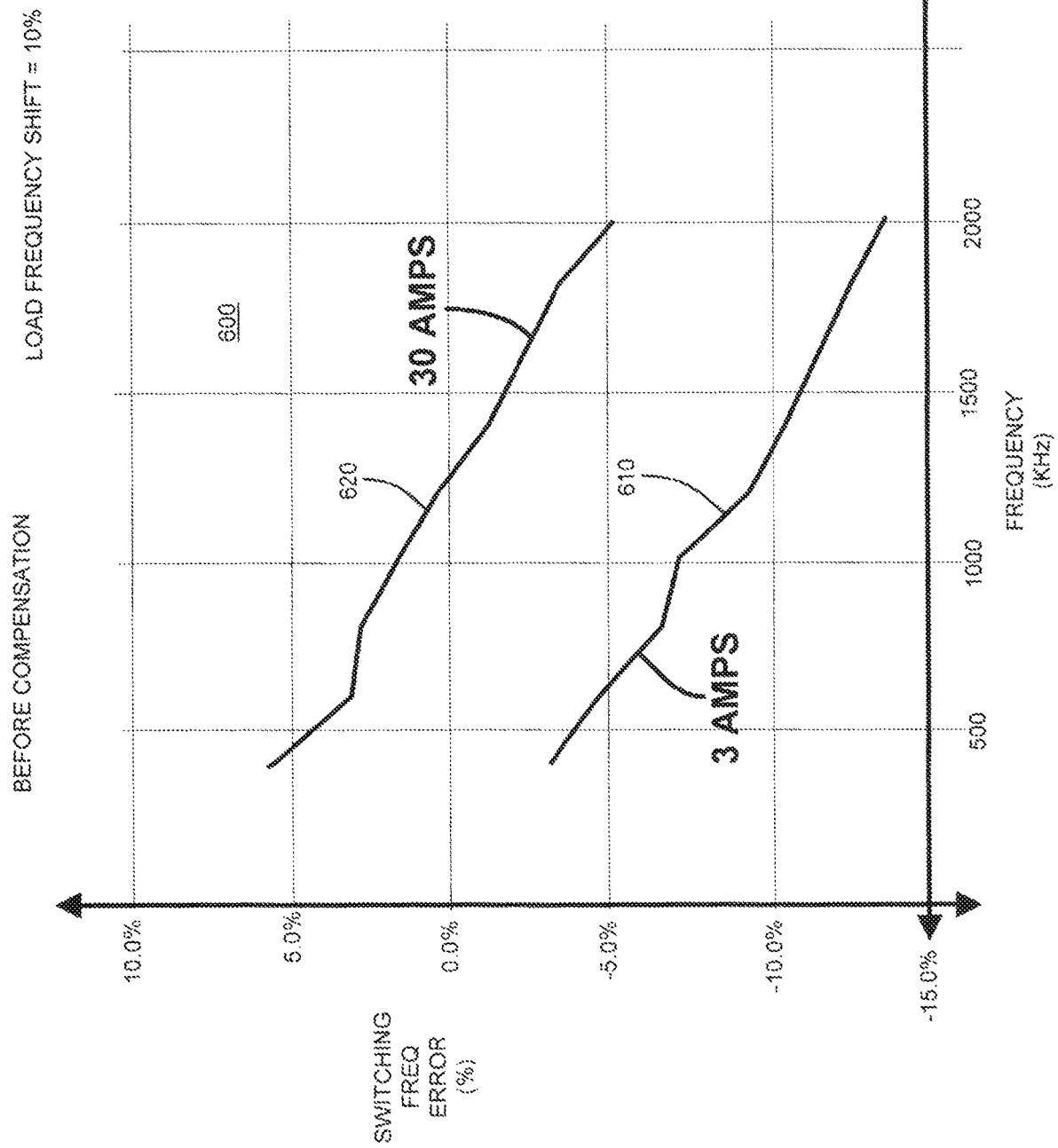
FIG. 6 is an example graph illustrating a frequency error with respect to a desired switching frequency setpoint of operating in a constant ON-time control mode before applying compensation according to embodiments herein.

FIG. 6 is an example graph illustrating a frequency error with respect to a desired switching frequency setpoint of operating in a constant ON-time control mode before applying compensation according to embodiments herein.

As shown, graph 605 illustrates switching frequency error 610 (such as a plot of values in column 555 of data 510 for different setpoint switching frequencies in column 551 of data 510) of operating the power converter 100 without compensation. Graph 605 further illustrates switching frequency error 620 (such as a plot of values in column 556 of data 510 for different setpoint switching frequencies in column 551 of data 510) of operating the power converter 100 without compensation from compensator 150.

Figure 7:
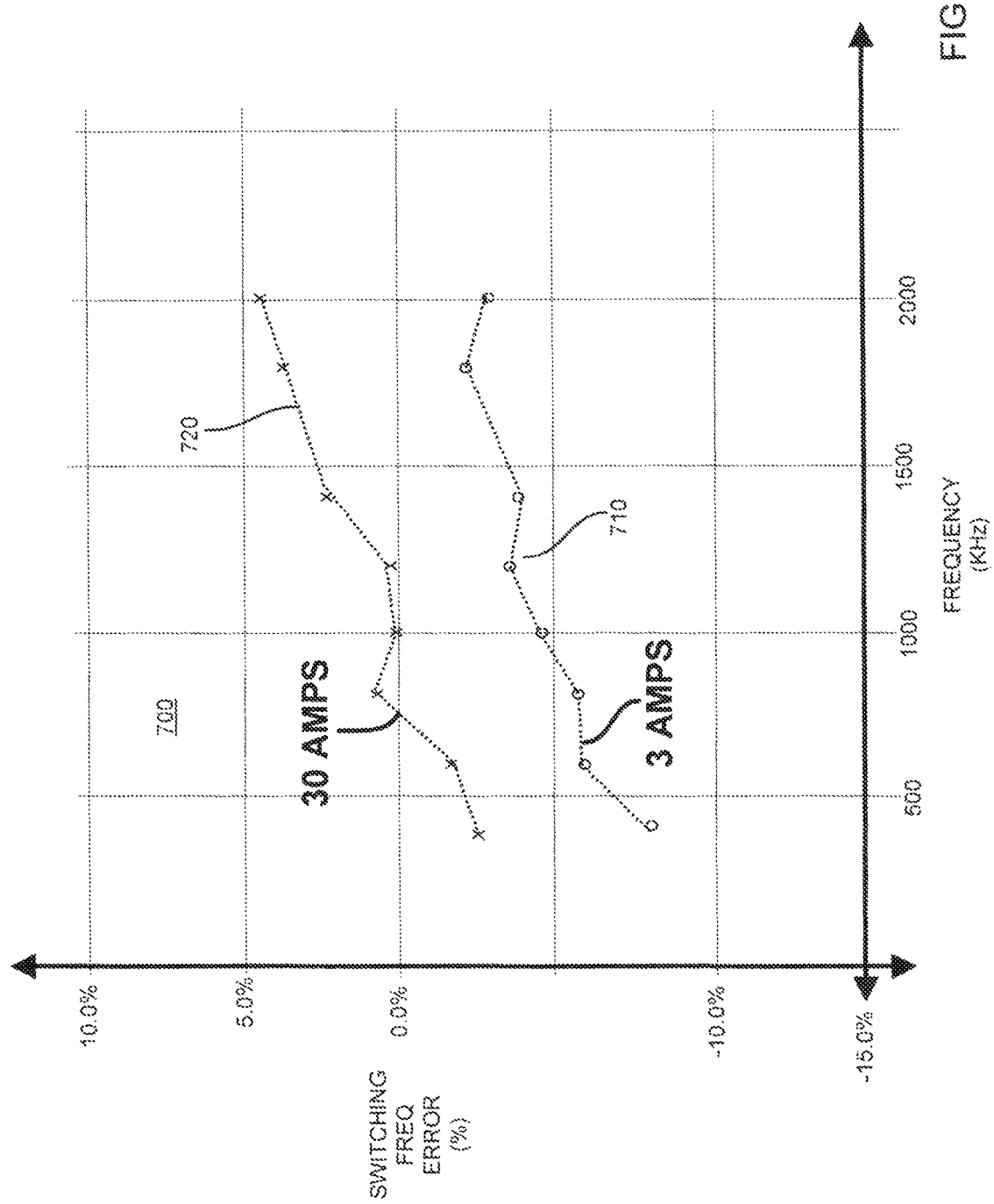
FIG. 7 is an example graph illustrating a frequency error with respect to a desired switching frequency setpoint of operating in a constant ON-time control mode after applying compensation according to embodiments herein.

FIG. 7 is an example graph illustrating a frequency error with respect to a desired switching frequency setpoint of operating in a constant ON-time control mode after applying compensation according to embodiments herein.

As shown, graph 705 illustrates switching frequency error 710 (such as a plot of values in column 555 of data 520 for different setpoint switching frequencies in column 551 of data 520) of operating the power converter 100 without compensation or with a very small amount of compensation. Graph 705 further illustrates switching frequency error 720 (such as a plot of values in column 556 of data 520 for different setpoint switching frequencies in column 551 of data 520) of operating the power converter 100 with compensation (increasing the constant ON-time by different amounts depending on an amount of current 131 consumed by the dynamic load 118 as previously discussed) from compensator 150.

Figure 8:
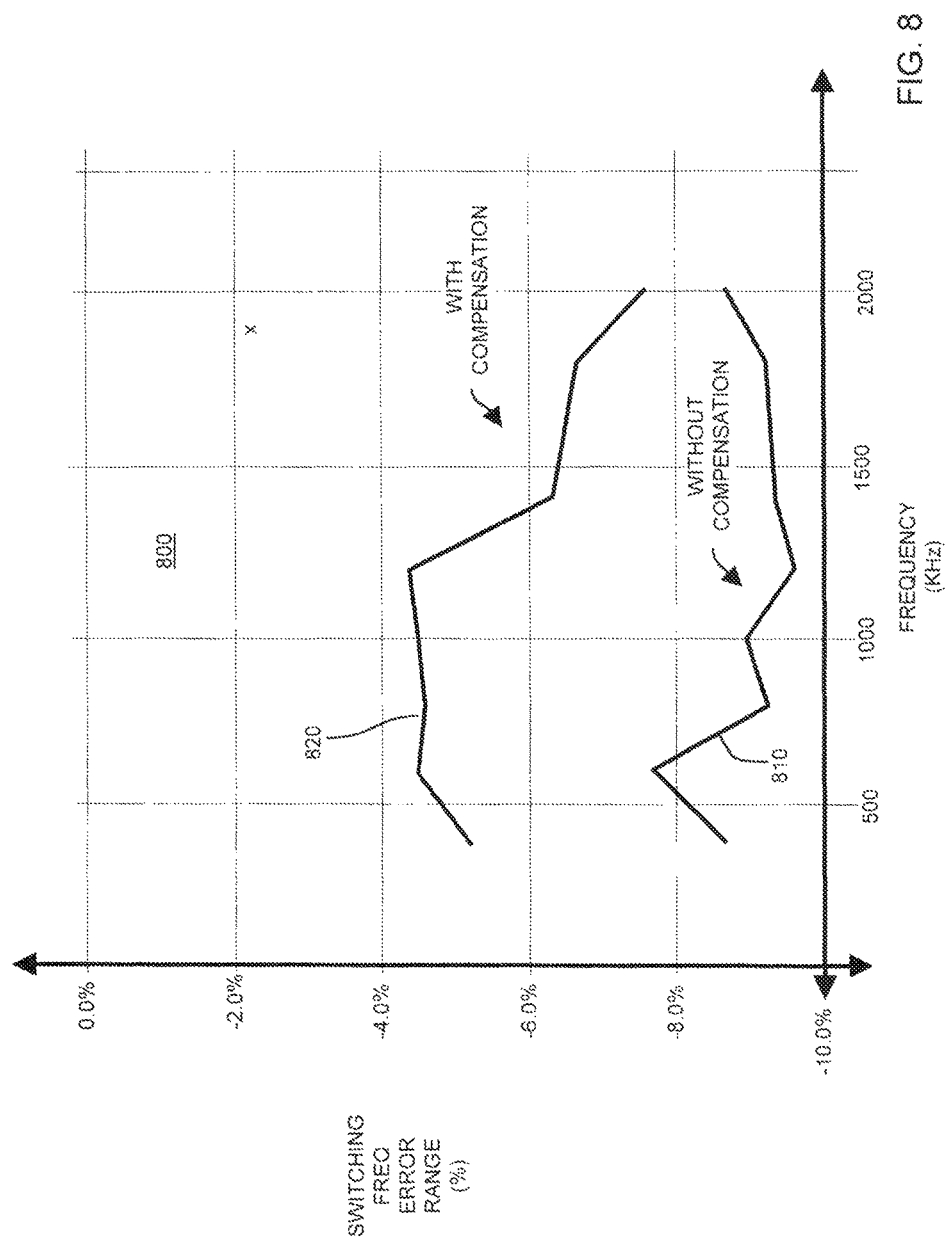
FIG. 8 is an example graph illustrating how application of compensation to an ON-time controller results in operation of a respective power converter and switch nearer to a desired setpoint switching frequency according to embodiments herein.

FIG. 8 is an example graph illustrating how application of compensation to an ON-time controller results in operation of a respective power converter and switch nearer to a desired setpoint switching frequency according to embodiments herein.

As shown, graph 805 illustrates the switching frequency error range 810 (such as a plot of values in column 557 of data 510 for different setpoint switching frequencies in column 551 of data 510) of operating the power converter 100 without compensation.

Graph 805 illustrates the switching frequency error range 820 (such as a plot of values in column 557 of data 520 for different setpoint switching frequencies in column 551 of data 520) of operating the power converter 100 with compensation.

In general, the graph 810 illustrates, via switching frequency error range 810 and switching frequency error range 820, how operation of the power converter 100 with the compensator 150 (supporting switching frequency error range 820) provides a smaller switching frequency range variation (and closer to the desired switching frequency operation) than operation of the power converter without the compensator 150 (supporting switching frequency variation error range 810).

Figure 9:
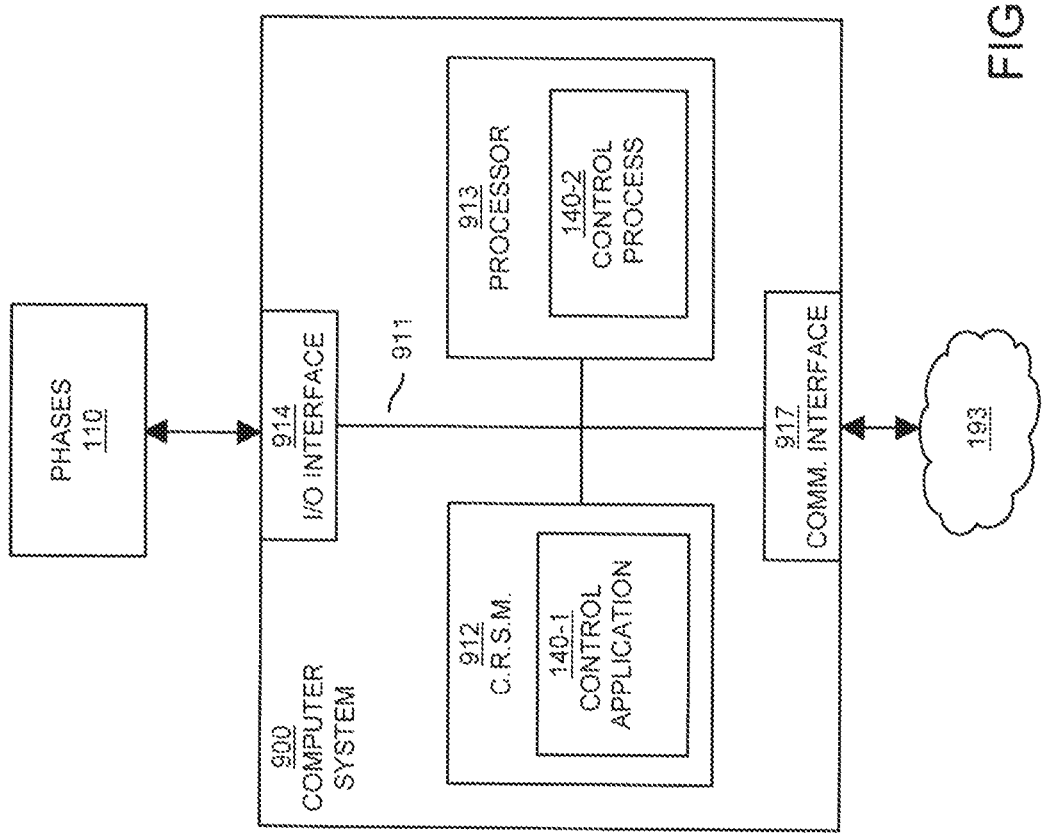
FIG. 9 is an example diagram illustrating computer processor hardware and related software instructions or logic circuit operative to execute methods according to embodiments herein.

FIG. 9 is an example block diagram of a computer device for implementing any of the operations as discussed herein according to embodiments herein.

As shown, computer system 900 (such as implemented by any of one or more resources such as controller 140, compensation setting generator 110, compensator 121, etc.) of the present example includes an interconnect 911 that couples computer readable storage media 912 such as a non-transitory type of media (or hardware storage media) in which digital information can be stored and retrieved, a processor 913 (e.g., computer processor hardware such as one or more processor devices), I/O interface 914, and a communications interface 917.

I/O interface 914 provides connectivity to any suitable circuitry such as each of phases 110.

Computer readable storage medium 912 can be any hardware storage resource or device such as memory, optical storage, hard drive, floppy disk, etc. In one embodiment, the computer readable storage medium 912 stores instructions and/or data used by the control application 140-1 to perform any of the operations as described herein.

Further in this example embodiment, communications interface 917 enables the computer system 900 and processor 913 to communicate over a resource such as network 193 to retrieve information from remote sources and communicate with other computers.

As shown, computer readable storage media 912 is encoded with control application 140-1 (e.g., software, firmware, etc.) executed by processor 913. Control application 140-1 can be configured to include instructions to implement any of the operations as discussed herein.

During operation of one embodiment, processor 913 accesses computer readable storage media 912 via the use of interconnect 911 in order to launch, run, execute, interpret or otherwise perform the instructions in control application 140-1 stored on computer readable storage medium 912.

Execution of the control application 140-1 produces processing functionality such as control process 140-2 in processor 913. In other words, the control process 140-2 associated with processor 913 represents one or more aspects of executing control application 140-1 within or upon the processor 913 in the computer system 900.

In accordance with different embodiments, note that computer system 900 can be a micro-controller device, logic, hardware processor, hybrid analog/digital circuitry, etc., configured to control a power supply and perform any of the operations as described herein.

Functionality supported by the different resources will now be discussed via flowchart in FIG. 9. Note that the steps in the flowcharts below can be executed in any suitable order.

Figure 10:
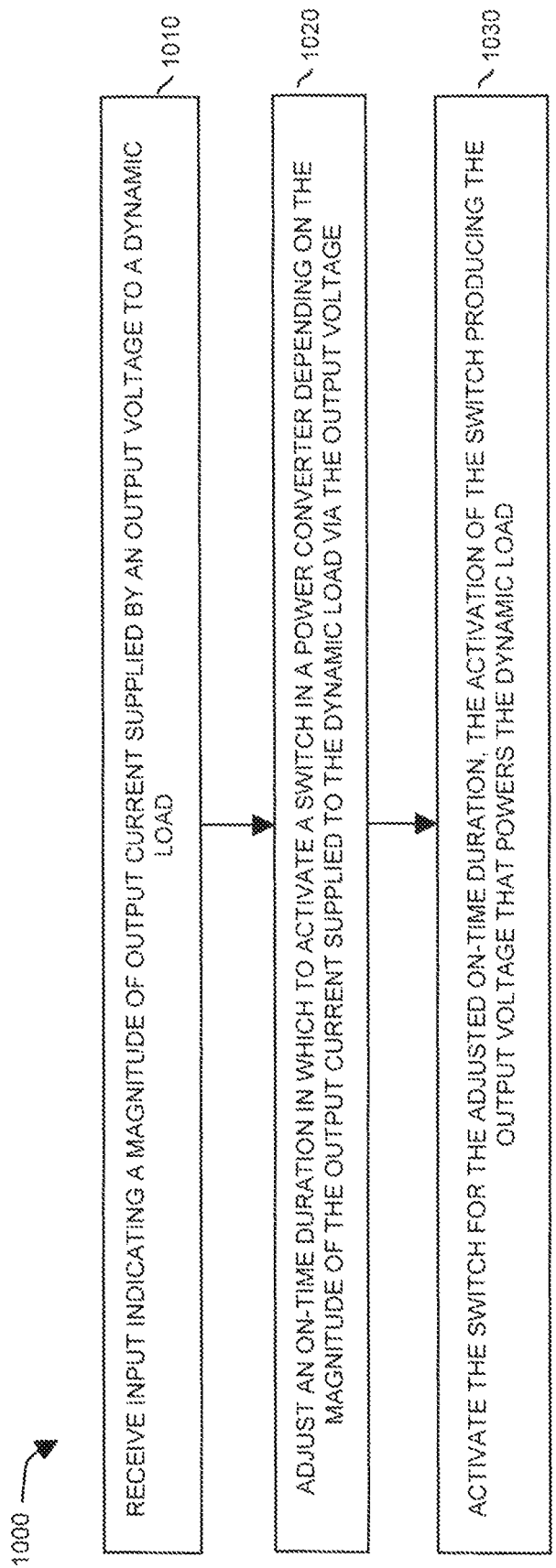
FIG. 10 is an example diagram illustrating a method according to embodiments herein.

FIG. 10 is an example diagram illustrating a method of providing compensation in a power converter according to embodiments herein.

In processing operation 1010, the compensator 150 receives input (such as signal 101) indicating a magnitude of output current 131 supplied by an output voltage 123 to a dynamic load 118.

In processing operation 1020, the compensator 150 adjusts an ON-time duration in which to activate a switch 151 in the power converter 100 depending on the magnitude of the output current 131 supplied to the dynamic load 118 via the output voltage 123.

In processing operation 1030, the ON-time controller 140 activates the switch (to an ON state) for the adjusted ON-time duration produced by the ON-time controller. The activation of the switch 151 produces the output voltage 123 (and corresponding current 131) that powers the dynamic load 118.

Figure 11:
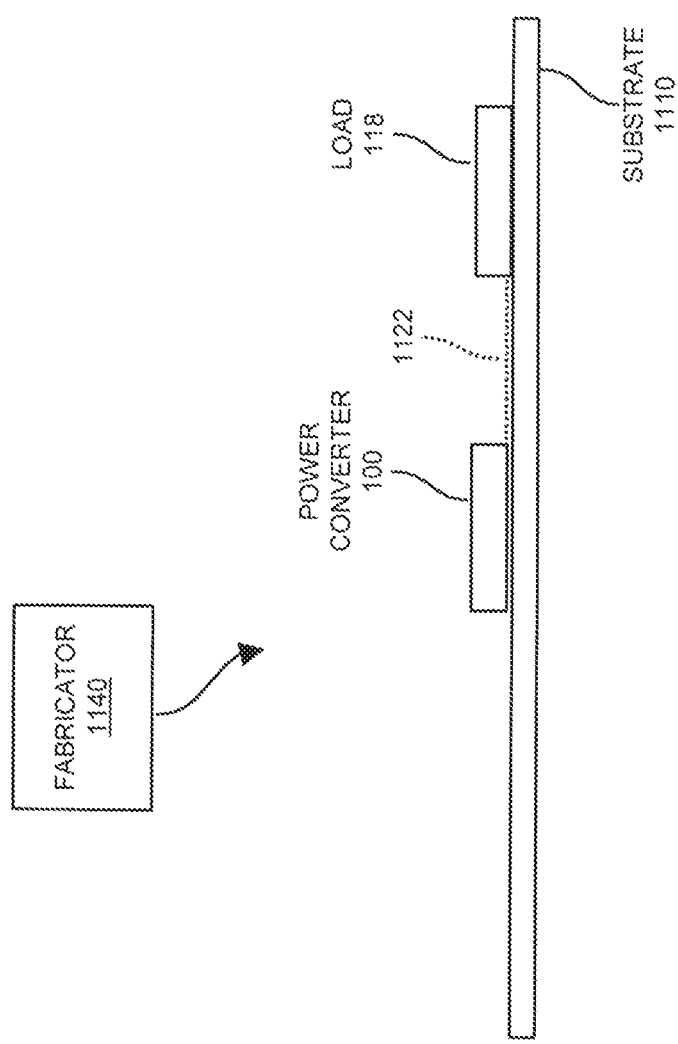
FIG. 11 is an example diagram illustrating fabrication of a power converter circuit according to embodiments herein.

FIG. 11 is an example diagram illustrating fabrication of a power converter circuit on a circuit board according to embodiments herein.

In this example embodiment, fabricator 1140: receives a substrate 1110 (such as a circuit board).

The fabricator 1140 further affixes the power converter 100 (and corresponding components) to the substrate 1110. Via circuit path 1122 (such as one or more traces, etc.), the fabricator 1140 couples the power converter 100 to the load 118. In one embodiment, the circuit path 1122 conveys the output voltage 123 generated from the power converter 100 to the load 118. Via components or sub-circuitry such as monitor resource 145, compensator 150, ON-time controller 140, switch 151, inductor 144 (a.k.a., L1), etc., in a manner as described herein, the power converter 100 converts a received input voltage 121 into a respective output voltage 123 that drives load 118.

Accordingly, embodiments herein include a system comprising: a substrate 1110 (such as a circuit board, standalone board, mother board, standalone board destined to be coupled to a mother board, etc.); a power converter 100 including corresponding components as described herein; and a load 118. As previously discussed, the load 118 is powered based on conveyance of output voltage 123 and corresponding current 131 conveyed over circuit path 1122 from the power converter 100 to the load 118.

Note that the load 1518 can be any suitable circuit or hardware such as one or more CPUs (Central Processing Units), GPUs (Graphics Processing Unit) and ASICs (Application Specific Integrated Circuits such those including one or more Artificial Intelligence Accelerators), which can be located on the substrate 1110 or disposed at a remote location.

Note again that techniques herein are well suited for use in circuit applications such as those that implement power conversion. However, it should be noted that embodiments herein are not limited to use in such applications and that the techniques discussed herein are well suited for other applications as well.

Based on the description set forth herein, numerous specific details have been set forth to provide a thorough understanding of claimed subject matter. However, it will be understood by those skilled in the art that claimed subject matter may be practiced without these specific details. In other instances, methods, apparatuses, systems, etc., that would be known by one of ordinary skill have not been described in detail so as not to obscure claimed subject matter. Some portions of the detailed description have been presented in terms of algorithms or symbolic representations of operations on data bits or binary digital signals stored within a computing system memory, such as a computer memory. These algorithmic descriptions or representations are examples of techniques used by those of ordinary skill in the data processing arts to convey the substance of their work to others skilled in the art. An algorithm as described herein, and generally, is considered to be a self-consistent sequence of operations or similar processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has been convenient at times, principally for reasons of common usage, to refer to such signals as bits, data, values, elements, symbols, characters, terms, numbers, numerals or the like. It should be understood, however, that all of these and similar terms are to be associated with appropriate physical quantities and are merely convenient labels. Unless specifically stated otherwise, as apparent from the following discussion, it is appreciated that throughout this specification discussions utilizing terms such as "processing," "computing," "calculating," "determining" or the like refer to actions or processes of a computing platform, such as a computer or a similar electronic computing device, that manipulates or transforms data represented as physical electronic or magnetic quantities within memories, registers, or other information storage devices, transmission devices, or display devices of the computing platform.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

We claim:

1. An apparatus comprising:
   a switch, activation of which generates an output voltage, the output voltage powering a dynamic load;
   an ON-time controller operative to control an ON-time duration of activating the switch and generation of the output voltage; and
   a compensator in communication with the ON-time controller, the compensator operative to adjust the ON-time duration of activating the switch depending on a magnitude of output current delivered by the output voltage to the dynamic load.

2. The apparatus as in claim 1, wherein adjustments to the ON-time duration increases efficiency of producing the output voltage during control operation of the switch in a constant ON-time control mode over multiple control cycles.

3. The apparatus as in claim 1, wherein the compensator is operative to produce an adjustment signal inputted to the ON-time controller, the adjustment signal increasing the ON-time duration and decreasing a switching frequency of activating the switch in a constant ON-time control mode over multiple control cycles based on the magnitude of output current delivered by the output voltage to the dynamic load.

4. The apparatus as in claim 1 further comprising:
   a power converter circuit in which the switch resides, the power converter circuit operative to convert an input voltage into the output voltage; and
   wherein the adjusted ON-time duration provides compensation of a frequency shift caused by resistive losses of the power converter circuit.

5. The apparatus as in claim 4, wherein the power converter circuit is operative to power the dynamic load over a range of current consumption by the dynamic load; and
   wherein the compensator is operative to increase a magnitude of the ON-time duration in response to detecting an increase in the current consumption by the dynamic load.

6. The apparatus as in claim 1 further comprising:
   a current monitor resource operative to monitor a magnitude of the output current delivered to the dynamic load via the output voltage.

7. The apparatus as in claim 1, wherein the ON-time controller comprises:
   a capacitor; and
   a current source operative to supply current to the capacitor.

8. The apparatus as in claim 7, wherein the current supplied to the capacitor produces a ramp voltage on the capacitor, the apparatus further comprising:
   a comparator operative to compare the ramp voltage to a threshold value.

9. The apparatus as in claim 8, wherein the compensator is operative to produce a drain current that reduces a magnitude of the supply current delivered to the capacitor.

10. The apparatus as in claim 1, wherein the ON-time controller is operative to produce the ON-time duration as a function of an input voltage and the output voltage, the switch controlled to convert the input voltage into the output voltage.

11. The apparatus as in claim 1, wherein the ON-time controller includes a first input and a second input, the first input operative to receive an input voltage, the second input operative to receive the output voltage; and
    wherein the ON-time controller is further operative to produce the ON-time duration of controlling the switch based on a magnitude of the input voltage and a magnitude of the output voltage.

12. The apparatus as in claim 1 further comprising:
    an inductor; and
    wherein activation of the switch for the ON-time duration provides a low impedance path between an input voltage source and the inductor that produces the output voltage.

13. A system comprising:
    a circuit substrate;
    the apparatus of claim 1, the apparatus fabricated on the circuit substrate; and
    a load, the load powered by the output voltage.

14. A method comprising:
    receiving a circuit substrate; and
    fabricating the apparatus of claim 1 on the circuit substrate.

15. The apparatus as in claim 1, wherein the compensator is operative to, for a given switching frequency of switching the switch, increase a magnitude of the ON-time duration in response to detecting an increase in the output current to the dynamic load.

16. The apparatus as in claim 1, wherein the compensator is operative to decrease a magnitude of the ON-time duration in response to detecting a decrease in the output current to the dynamic load.

17. The apparatus as in claim 1, wherein the ON-time controller is further operative to adjust the ON-time duration of controlling the switch based on a magnitude of an input voltage and a magnitude of the output voltage.

18. The apparatus as in claim 1, wherein the adjustment of the ON-time duration is operative to adjust a switching frequency of the switch to be nearer a desired switching frequency setpoint of converting an input voltage into the output voltage.

19. The apparatus as in claim 1, wherein the ON-time controller is operative to: i) select a switching frequency and ON-time duration in which to control activation of the switch; and ii) adjust a magnitude of the ON-time duration depending on the magnitude of the output current.

20. The apparatus as in claim 19, wherein the ON-time duration varies based at least in part on a magnitude of an input voltage being converted into the output voltage via switching of the switch between ON and OFF states.

21. The apparatus as in claim 1, wherein the ON-time controller is operative to: i) select a switching frequency at which to control the switch to ON and OFF states, and ii) adjust a magnitude of the ON-time duration of the selected switching frequency depending on the magnitude of the output current; and
   wherein the adjustment of the ON-time duration based on the magnitude of the output current causes a deviation with respect to the selected switching frequency.

22. The apparatus as in claim 1, wherein the ON-time controller is operative to control a rate of ramping a ramp signal to produce the ON-time duration.

23. The apparatus as in claim 22, wherein the ON-time controller is operative to adjust the rate of ramping the ramp signal based on the magnitude of the output current.

24. The apparatus as in claim 23, wherein the ON-time controller is operative to compare the ramp signal to a threshold value to control the ON-time duration, the threshold value derived based at least in part on a magnitude of the output voltage.

25. The apparatus as in claim 1, wherein the ON-time controller is operative to control a rate of ramping a ramp signal used to control the ON-time duration, a rate of change of the ramp signal depending on a magnitude of an input voltage, activation of the switch converting the input voltage into the output voltage.

26. The apparatus as in claim 25, wherein the ON-time controller is operative to compare the ramp signal to a threshold value to control the ON-time duration, the threshold value derived based at least in part on a magnitude of the output voltage.

27. The apparatus as in claim 26, wherein the ON-time controller is operative to adjust the rate of ramping the ramp signal based on the magnitude of the output current.

28. A method comprising:
   receiving input indicating a magnitude of output current supplied by an output voltage to a dynamic load;
   adjusting an ON-time duration in which to activate a switch in a power converter depending on the magnitude of the output current supplied to the dynamic load via the output voltage; and
   activating the switch for the adjusted ON-time duration, the activation of the switch producing the output voltage that powers the dynamic load.

29. The method as in claim 28, wherein adjustments to the ON-time duration over multiple switch control cycles increases efficiency of generating the output voltage during a constant ON-time control mode of controlling the switch.

30. The method as in claim 28, wherein adjusting the ON-time duration comprises:
   producing an adjustment signal based on the magnitude of the output current; and
   applying the adjustment signal to an ON-time controller that generates the ON-time duration, application of the adjustment signal increasing the ON-time duration of activating the switch and decreasing a switching frequency of activating the switch in a constant ON-time control mode over multiple control cycles.

31. The method as in claim 28, wherein the adjusted ON-time duration provides compensation of a resistive loss of a power converter circuit that converts a received input voltage into the output voltage via the switch.

32. The method as in claim 31 further comprising:
   powering the dynamic load over a range of different current consumption by the dynamic load; and
   increasing a magnitude of the ON-time duration in response to detecting an increase in the current consumption by the dynamic load.

33. The method as in claim 28 further comprising:
   producing the ON-time duration via supply of current to a capacitor.

34. The method as in claim 33 further comprising:
   via the supply of current to the capacitor, producing a ramp voltage on the capacitor; and
   comparing the ramp voltage to a threshold value.

35. The method as in claim 34 further comprising:
   adjusting the ON-time duration of the switch via sinking current from the capacitor to a reference voltage.

36. The method as in claim 28 further comprising:
   producing the ON-time duration as a function of an input voltage and the output voltage, the input voltage converted into the output voltage via switching of the switch ON and OFF.

37. The method as in claim 28 further comprising:
   via activation of the switch, providing an electrically conductive path between an input voltage source and an inductor, the inductor outputting the output current supplied to the dynamic load.

38. Computer-readable storage hardware having instructions stored thereon, the instructions, when carried out by computer processor hardware, cause the computer processor hardware to:
   receive input indicating a magnitude of output current supplied by an output voltage to a dynamic load;
   adjust an ON-time duration in which to activate a switch in a power converter depending on the magnitude of the output current supplied to the dynamic load via the output voltage; and
   activate the switch for the adjusted ON-time duration, the activation of the switch producing the output voltage that powers the dynamic load.

39. An apparatus comprising:
an ON-time controller operative to:
   control an ON-time duration of activating a switch, activation of the switch operative to generate an output voltage to power a dynamic load;
   receive compensation input from a compensator in communication with the ON-time controller, a magnitude of the compensation input depending on a magnitude of output current delivered by the output voltage to the dynamic load; and
   adjust the ON-time duration of activating the switch depending on the compensation input.

\* \* \* \* \*